US006787468B2

(12) United States Patent
Kim et al.

(10) Patent No.: US 6,787,468 B2
(45) Date of Patent: Sep. 7, 2004

(54) METHOD OF FABRICATING METAL LINES IN A SEMICONDUCTOR DEVICE

(75) Inventors: Byung-Hee Kim, Seoul (KR); Jong-Myeong Lee, Sungnam (KR); Myoung-Bum Lee, Seoul (KR); Gil-Heyun Choi, Sungnam (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 8 days.

(21) Appl. No.: 10/035,257

(22) Filed: Jan. 4, 2002

(65) Prior Publication Data

US 2002/0090811 A1 Jul. 11, 2002

(30) Foreign Application Priority Data

Jan. 8, 2001 (KR) ............................................. 2001-932

(51) Int. Cl.⁷ .............................................. H01L 21/44
(52) U.S. Cl. ........................ 438/688; 438/627; 438/632; 438/637; 438/643; 438/646; 438/653
(58) Field of Search .................................. 438/618, 627, 438/632, 643, 646, 637, 653, 688; 257/751, 752, 765

(56) References Cited

U.S. PATENT DOCUMENTS

| 5,534,463 | A | * | 7/1996 | Lee et al. | 438/643 |
| 5,877,086 | A | | 3/1999 | Aruga | 438/653 |
| 6,054,768 | A | * | 4/2000 | Givens et al. | 257/753 |
| 6,133,147 | A | * | 10/2000 | Rhee et al. | 438/677 |
| 6,143,645 | A | * | 11/2000 | Hsu et al. | 438/627 |
| 6,376,355 | B1 | * | 4/2002 | Yoon et al. | 438/618 |
| 6,432,820 | B1 | * | 8/2002 | Lee et al. | 438/677 |

FOREIGN PATENT DOCUMENTS

JP  4-171940  6/1992

OTHER PUBLICATIONS

Zhao et al. TIA3 Formation by Furnace Annealing of TI/AL Bilayers and the effect of Impurities Apr. 15, 1988, J. Appl. Phys pp. 2800–2807.
Voutsas et al, Structure Engineering for Hilock–Free Pure Aluminum, etc. . . . Jul./Aug. 1998 J. Vac. Sci. Technol. pp. 2668–2670.
Kim et al. Creep–controlled Diffusional Hillock Formation in Blanket, etc. . . , Aug. 2000, Jounal of Materials Research, vol. 15, Issue 8, pp. 1709–1718.
Liu et al. Formation of Intermetallic Nanocomposites in the TIALSI System by Mechanical, etc., May 1998, Journal of Materials Research, vol. 13, Issue 5, pp. 1198–1203.

* cited by examiner

Primary Examiner—Maria Guerrero
(74) Attorney, Agent, or Firm—Lee & Sterba, P.C.

(57) ABSTRACT

A method of fabricating a semiconductor device having a recess region in an insulation layer on a silicon substrate, comprising the steps of depositing a barrier metal over the entire surface of the insulation layer including the substrate surface in the recess region, depositing selectively an anti-nucleation layer on the barrier metal except in the recess region, depositing a CVD-Al layer on the barrier metal in the recess region, depositing a metal or a metal alloy inhibiting aluminum migration on the anti-nucleation layer and the barrier metal except in the recess region, and depositing a PVD-Al layer and re-flowing the PVD-Al layer, for improving the quality of aluminum grooves. The present method inhibits PVD-Al migration and grain growth, which results in preventing abnormal patterning in the semiconductor device.

3 Claims, 7 Drawing Sheets

METHOD OF FABRICATING METAL LINES IN A SEMICONDUCTOR DEVICE

BACKGROUND OF THE INVENTION

1. Field of the Invention

The present invention relates to a method of fabricating a semiconductor device and, more particularly, to a method of fabricating metal lines in a semiconductor integrated circuit.

2. Description of the Related Art

An integrated semiconductor device comprises transistors, resistances and capacitors, and requires metal lines for fabricating the device on a silicon wafer. Because the metal lines transmit electrical signals, characteristics such as low electrical resistance, low cost, and high reliability, are required in the metal lines. Aluminum is one of the materials satisfying the above-described requirements. Accordingly, aluminum is widely used in making the metal line.

As the degree of integration of an integrated semiconductor device is increased, however, the width and the thickness of metal lines as well as the size of contact holes decrease. As the size of contact holes decrease, its aspect ratio is increased, and hence it becomes more difficult to fill the contact hole with aluminum. Accordingly, the technology of filling the contact holes completely with aluminum becomes more critical as the degree and level of integration in semiconductor devices increase.

One of the technologies used for completely filling high aspect ratio contact holes with aluminum is a chemical vapor deposition aluminum (CVD-Al) process. Generally, there are two types of CVD-Al process. A first type is a blanket aluminum process, and a second type is a selective aluminum process.

The blanket aluminum process utilizes and takes advantage of the excellent step coverage characteristic of aluminum metal. The blanket Al process deposits aluminum metal over the entire surface of a wafer to fill up contact holes. As is generally known, however, the CVD-Al process exhibits a peculiar growth characteristic beyond a certain thickness by generating a greater wafer roughness and by not completely filling small contact holes. On the other hand, the selective aluminum process utilizes the property of a difference in growth rate of Al on an insulation layer and a conductive layer in a restricted area such as via contacts and, hence, can not be employed in forming a metal contact involving a barrier metal. Accordingly, a new technology for lowering the contact resistance and a metal line resistance, and for completely filling up contact holes is necessary and essential for fabricating current day highly integrated semiconductor devices.

Japanese patent publication No. 4-171940 discloses a fabrication process for filling up contact holes of a semiconductor device. According to the fabrication process disclosed and taught by this publication, an ohmic contact layer is initially deposited and then a barrier layer is deposited as an intermediate layer in a contact hole. Subsequently, either an Al layer or an Al alloy layer is deposited on the intermediate layer. After removing most of the Al layer on the sidewall of the contact hole and most of the barrier layer at the bottom of the contact hole, the remaining Al layer is re-flowed to the bottom of the contact hole. Finally, a new Al layer is deposited in the contact hole to fill up the contact hole.

U.S. Pat. No. 6,022,800 discloses another fabrication process for filling up a contact hole. According to the fabrication process disclosed and taught in this patent, a first titanium nitride TiN layer is deposited over the entire surface of the contact hole by a chemical vapor deposition (CVD) method, and thereafter a second TiN layer is deposited on the first TiN layer by a physical vapor deposition (PVD) method. Thereafter, a sufficient amount of tungsten is deposited to fill up the contact hole.

Japanese patent publication No. 10-64902 discloses another fabrication process for filling up a contact hole. According to the fabrication process disclosed and taught by this publication, a barrier layer in the form of a Ti layer or a TiN layer is initially deposited on a wafer surface by a physical vapor deposition PVD method. A metal layer with improved wettability, comprising aluminum and titanium, is then deposited on the barrier layer to prevent a metal line from reacting with a sub-silicon or with a sub-metal line. Aluminum is then re-flowed to fill up the contact hole.

Another approach that has been used in filling up contact holes is called a preferential metal deposition (PMD) process. The PMD process deposits an aluminum layer in the same way as the blanket Al process does and by improving the selectivity ratio of an aluminum sub-layer.

Referring to FIG. 1A, in the PMD process, an insulation layer 3 is initially deposited on a silicon substrate 1. After generating a contact hole 35, a barrier metal layer 5 is deposited on the contact hole 35 and the insulation layer 3. An anti-nucleation layer (ANL) 7 is generated on the surface of the barrier metal layer 5, except in the contact hole 35. A physical vapor deposition (PVD) process, or a chemical vapor deposition (CVD) process performed in the condition of worse conformability, deposits an oxidation metal such as aluminum Al, zirconium Zr, titanium Ti, strontium Sr, magnesium Mg, barium Ba, calcium Ca, cerium Ce, and yttrium Y, etc. Subsequently, either the PVD process or the CVD process oxidizes the deposited metal layer by exposure to air or by oxygen plasma process to generate the ANL 7. Referring to FIG. 1b to FIG. 1d, a CVD-Al process selectively deposits the metal layer 9 in the contact hole 35. Subsequently, a physical vapor deposition aluminum PVD-Al process deposits an aluminum layer 11 and fills up the contact hole 35 by a re-flow process.

However, the re-flowed PVD-Al according to the above-described patents and to the PMD-Al process is migrated on the ANL, and the migration is very active because the deposited Al does not react with the ANL. As a result, uncontrolled grain growth can be observed in the deposited Al, which generates greater depth difference of the grain boundary. As a result, fabrication defects, such as ring defects, can occur during the succeeding process steps.

SUMMARY OF THE INVENTION

To overcome the above described problems, preferred embodiments of the present invention provide a method of fabricating a semiconductor device that inhibits atomic migration of aluminum deposited by a PVD method and abnormal growth of the aluminum grain, by which abnormal metal line patterns in a semiconductor integrated circuit is avoided.

The preferred embodiments of the present invention provide a method of fabricating a semiconductor device having a recess region in an insulation layer on a silicon substrate, comprising the steps of depositing a barrier metal over the entire surface of the insulation layer including the substrate surface in the recess region, depositing selectively an anti-nucleation layer on the barrier metal except in the recess region, depositing a CVD-Al layer on the barrier metal in the recess region, depositing a metal or a metal alloy for inhibiting aluminum migration on the barrier metal except in the recess region, and depositing a PVD-Al layer and re-flowing the PVD-Al layer.

The metal or the metal alloy inhibiting aluminum migration may be selected from Ti, TiN, Ti/TiN, Ta, TaN and Ta/TaN with a thickness of less than 10 nm.

These and other features of the present invention will be readily apparent to those of ordinary skill in the art upon review of the detailed description that follows.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF THE INVENTION

Korean Patent Application No. 2001-932, filed on Jan. 8, 2001, and entitled: "Fabrication Method in Semiconductor Device", is incorporated by reference herein in its entirety.

Reference will now be made in detail to preferred embodiments of the present invention, an example of which is illustrated in the accompanying drawings. FIGS. 2A to 2E are sequential diagrams illustrating a method of fabricating a semiconductor integrated circuit according to a preferred embodiment of the present invention.

After generating an insulation layer 3 on a silicon substrate 1, a predetermined area of the insulation layer 3 is etched to pattern the insulation layer 3 to have a recess region. The above etching process employs one of normal etching processes. The recess region can be a contact hole exposing a certain area of the silicon substrate 1, or a groove, which is thinner than the insulation layer 3. The recess region is a groove in case of a damascene process.

Figure 1A:
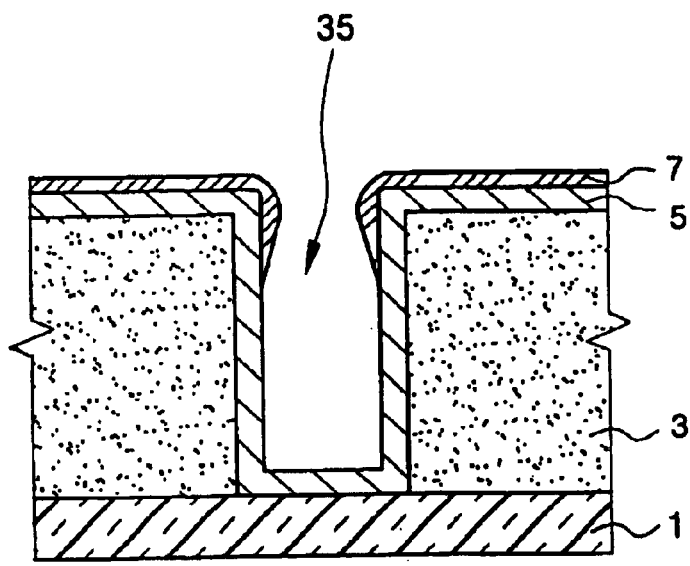
FIGS. 1A to 1D are sequential diagrams illustrating a conventional method of fabricating a semiconductor integrated circuit.
Figure 1B:
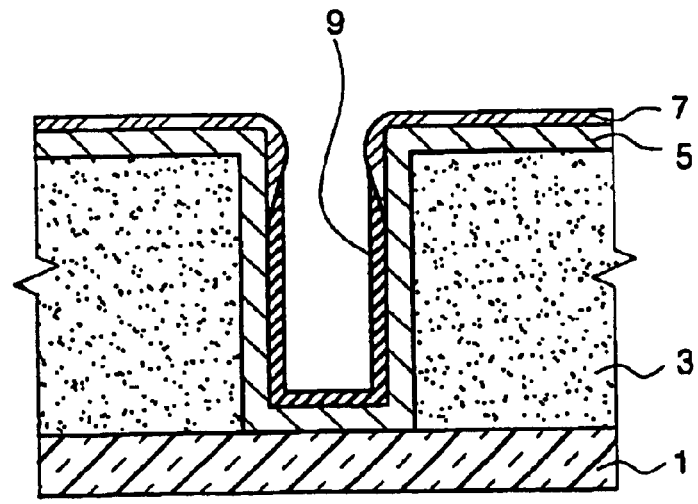
Figure 1C:
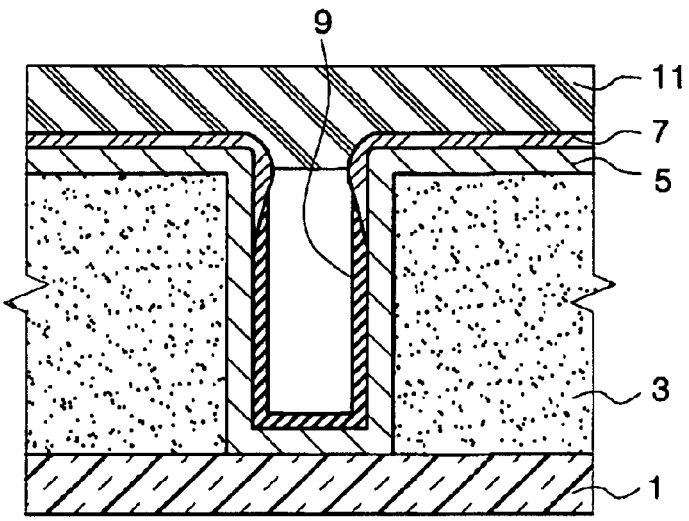
Figure 1D:
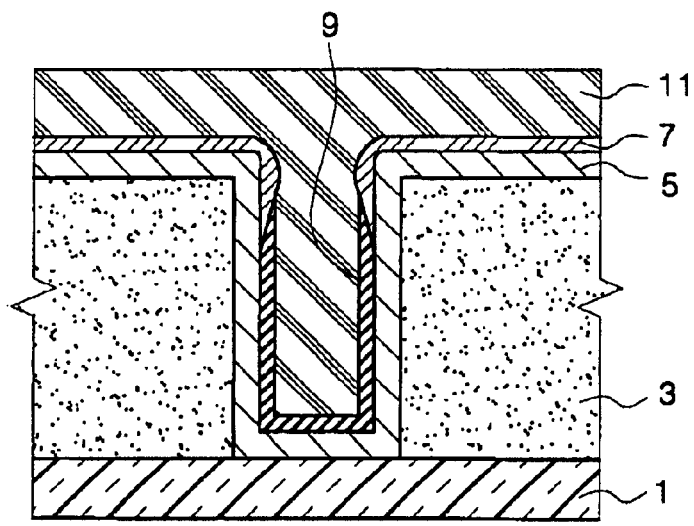
Figure 2A:
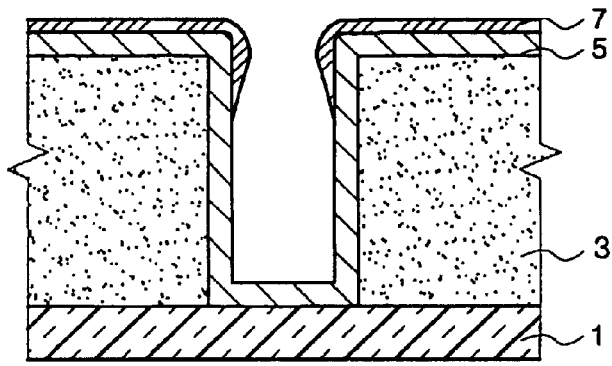
FIGS. 2A to 2E are sequential diagrams illustrating a method of fabricating a semiconductor integrated circuit according to a preferred embodiment of the present invention.

Referring to FIG. 2A, a barrier metal layer 5 or a wetting layer 5 is generated on the patterned insulation layer 3 including the substrate surface in the recess region. When the recess region is a contact hole exposing source and drain areas of a transistor on the silicon substrate 1, it is preferable to form an ohmic metal layer on the patterned insulation layer 3 before the barrier metal 5 is generated. Subsequently, an anti-nucleation layer (ANL) 7 is selectively generated on the surface of the barrier metal layer 5 except in the recess region so that the barrier metal layer 5 in the side walls and the bottom of the recess region is exposed to the air.

Figure 2B:
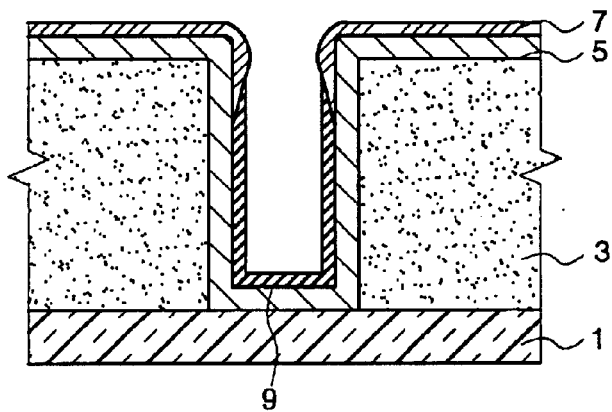

Referring to FIG. 2B, using a chemical vapor deposition aluminum (CVD-Al) process, an aluminum layer is deposited only on the barrier metal layer 5 and not on the ANL 7. As described above, the ANL 7 exposing the barrier metal layer 5 of the recess region to the air helps to form a metal layer, such as Al and Cu, selectively in the recess region, because a metallic nucleation period on the ANL 7 is about ten times longer than that on the barrier metal 5.

Another method for filling up the recess region selectively is a metal organic chemical vapor deposition (MOCVD) process. After forming a metal layer using the MOCVD process, an aluminum layer or an aluminum alloy layer is deposited additionally to fabricate a metal line.

Figure 2C:
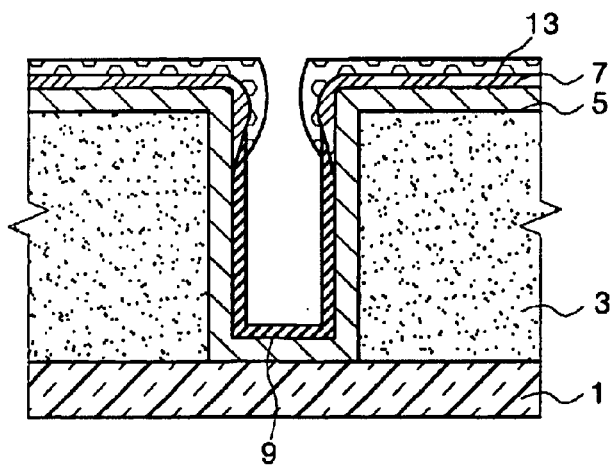
Figure 2D:
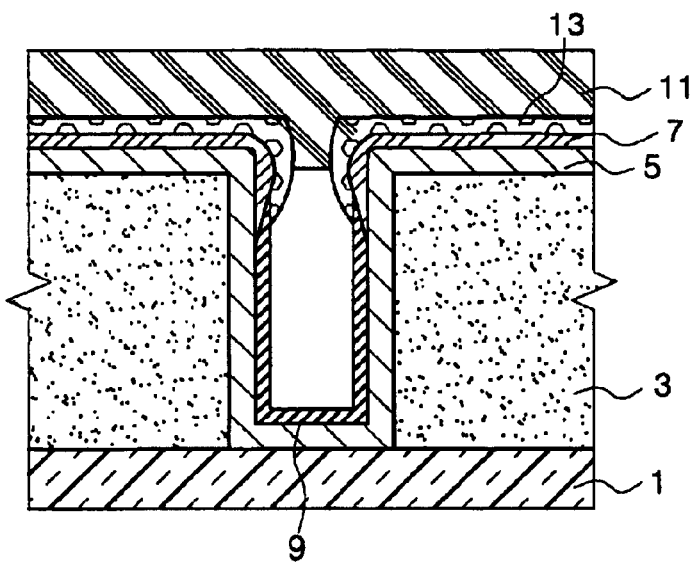
Figure 2E:
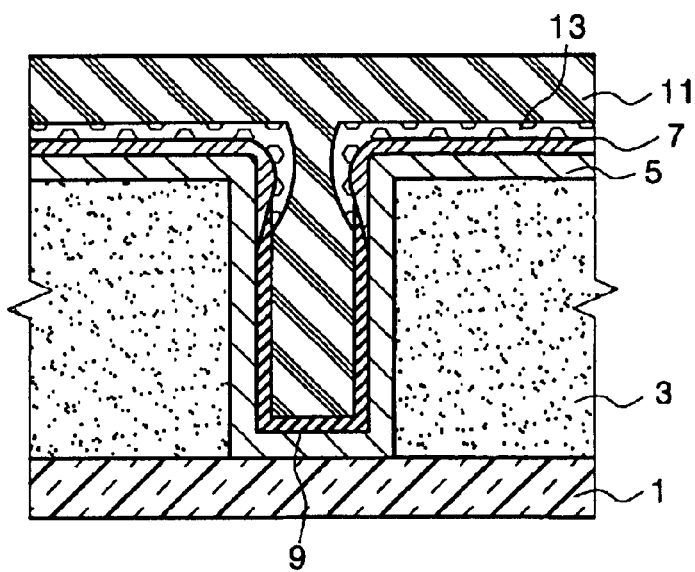

Referring to FIG. 2C, a metal 13 or a metal alloy 13 from a group consisting of titanium Ti, titanium nitride TiN, Ti/TiN alloy, tantalum Ta, tantalum nitride TaN, Ta/TaN alloy, is deposited on the ANL 7. It is preferable that the deposition thickness of the metal or the metal alloy is less than 100 Å. Using a PVD-Al process, an aluminum layer 11 is then deposited as shown in FIG. 2D, and a metal line is fabricated using a reflowing process as shown in FIG. 2E.

In the conventional PMD-Al process, the PVD-Al 11 is re-flowed and migrated on to the ANL 7. The PVD-Al 11 actively migrates on to the ANL 7 because the PVD-Al rarely reacts with the ANL 7. Therefore, grain growth rate of the PVD-Al is so excessively high that a depth difference between the center of the grain and the grain boundary becomes larger, which results in generating ring defects during the succeeding process steps.

Figure 3A:
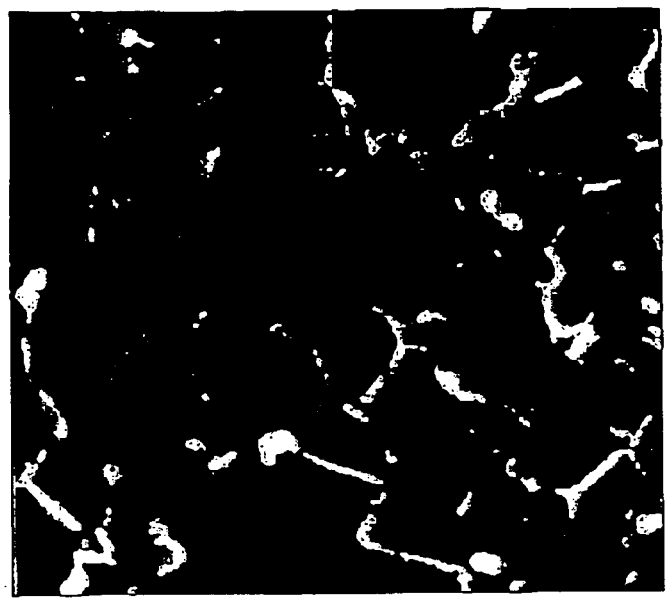
FIG. 3A is an Atomic Force Microscope (AFM) photograph of an aluminum surface in the conventional PMD process.
Figure 3B:
FIG. 3B is an Atomic Force Microscope (AFM) photograph of an aluminum surface after re-flowing the deposited aluminum according to the preferred embodiment of the present invention.

FIGS. 3A and 3B illustrate the above described phenomena. The sub-layer of the PVD-Al layer in FIG. 3A is an ANL and that of FIG. 3B is a TiN layer when the PVD-Al is migrated by heat energy in a metal re-flowing process. A reaction of the PVD-Al with the TiN layer occurs slightly to inhibit PVD-Al migration on the TiN layer. A reaction of the PVD-Al with the ANL, however, rarely occurs, and hence promotes active PVD-Al migration on the ANL.

Figure 4:
FIG. 4 is a Scanning Electronic Microscope (SEM) photograph showing ring defects in the conventional PMD process.

As described above, when the PVD-Al actively migrates, the grain growth of the aluminum metal is promoted so that a depth difference between the center of the grain and the grain boundary is increased. A large depth difference in the PVD-Al generates abnormal metal lines after patterning and etching the PVD-Al in the succeeding photolithography process. Those abnormal metal lines are called "ring defects", as shown in FIG. 4, which is one of the aluminum grooves.

Therefore, the present invention provides surroundings where the PVD-Al can migrate on a metal or a metal alloy from a group consisting of Ti, TiN, Ti/TiN, Ta, TaN, and Ta/TaN, not on an ANL. The initial process of creating such surroundings is to deposit the metal or the metal alloy, such as Ti or TiN, after the ANL and the CVD-Al process. The following process is the PVD-Al deposition and re-flowing.

Figure 5A:
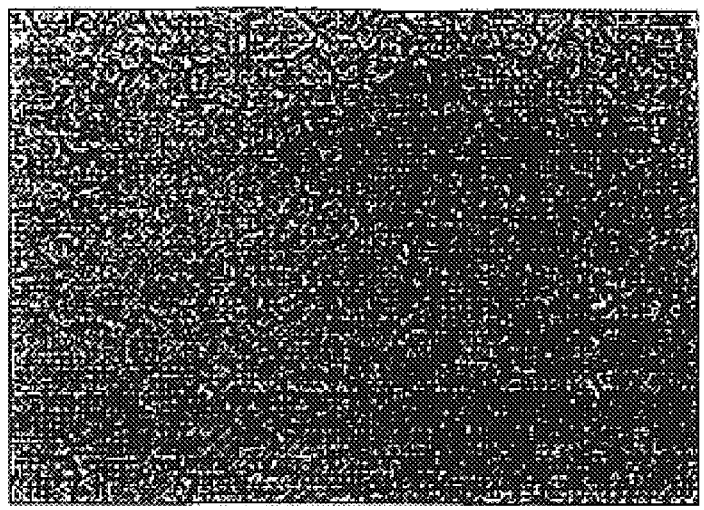
FIG. 5A is a micrograph of the surface of a semiconductor integrated circuit fabricated by the conventional PMD process.
Figure 5B:
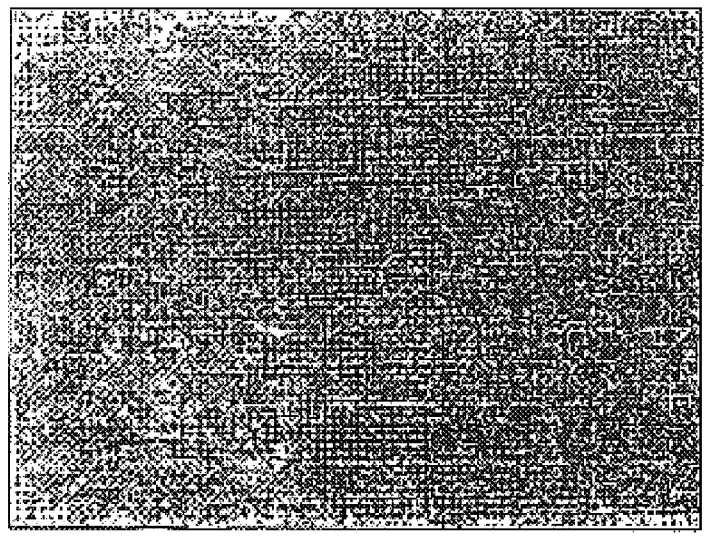
FIG. 5B is a micrograph of the surface of a semiconductor integrated circuit fabricated according to the preferred embodiment of the present invention.

FIGS. 5A and 5B are micrographs of the aluminum surfaces after the PVD-Al deposition. The aluminum surface according to the present invention, as shown in FIG. 5B, is more homogeneous than that of the conventional technology, as shown in FIG. 5A.

Therefore, the abnormal patterning consisting of the ring defects can be inhibited according to the present invention.

As described above, the method of fabricating a semiconductor device according to the present invention inhibits PVD-Al migration and grain growth, which results in preventing abnormal patterning in the semiconductor device.

The invention has been particularly shown and described with reference to preferred embodiments thereof. Although specific terms are employed, they are used in a generic and descriptive sense only and not for purpose of limitation. Accordingly, it will be understood by those skilled in the art that various changes in form and details may be made without departing from the spirit and scope of the invention as set forth in the following claims.

What is claimed is:

1. A method of fabricating a semiconductor device having a recess region in an insulation layer on a silicon substrate, the method comprising the steps of:

depositing a barrier metal on the whole surface of the insulation layer including the substrate surface in the recess region;

depositing selectively an anti-nucleation layer on the barrier metal except in the recess region;

depositing a CVD-Al layer on the barrier metal in the recess region;

depositing a metal or a metal alloy for inhibiting aluminum migration on the anti-nucleation layer and the barrier metal except in the recess region; and depositing a PVD-Al layer and reflowing the PVD-Al layer.

2. The fabrication method of claim 1, wherein the metal or the metal alloy inhibiting aluminum migration is one of Ti, TiN, Ti/TiN, Ta, TaN and Ta/TaN.

3. The fabrication method of claim 1, wherein a deposition thickness of the metal or the metal alloy inhibiting aluminum migration is less than 100 Å.

* * * * *